United States Patent
Martens (10) Patent No.: US 6,832,170 B2
(45) Date of Patent: Dec. 14, 2004

(54) METHODS FOR EMBEDDING AND DE-EMBEDDING USING A CIRCULATOR

(75) Inventor: Jon S. Martens, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 133 days.

(21) Appl. No.: 10/137,694

(22) Filed: May 2, 2002

(65) Prior Publication Data

US 2003/0208327 A1 Nov. 6, 2003

(51) Int. Cl.[7] .............................................. G06F 19/00
(52) U.S. Cl. .................................... 702/65; 324/76.19
(58) Field of Search ................. 702/65, 117; 324/76.19; 359/128

(56) References Cited

U.S. PATENT DOCUMENTS

2002/0053899 A1 * 5/2002 Adamian et al. ......... 324/76.19
2002/0080446 A1 * 6/2002 Derventzis et al. .......... 359/128
2003/0135344 A1 * 7/2003 Martens ...................... 702/117

OTHER PUBLICATIONS

Gonzalez, G., Microwave Transistor Amplifiers: Analysis and Design, Chapters 1 and 2, pp. 1–90, Second Edition, Prentice–Hall, New Jersey (1996).
http://www.rfcafe.com/references/electrical/circulators.htm, "Circulators and Diplexers," 3 pages (Mar. 5, 2002).
Bauer, R.F. and Penfield, Jr., P., "De–Embedding and Unterminating", IEEE Transactions Of Microwave Theory and Technique, vol. MTT–22, No. 3, Mar. 1974, pp. 282–288.
Collin, R.E., *Foundations for Microwave Engineering*, McGraw–Hill, 1966, Chapter 6 entitled "Passive Microwave Devices", pp. 259–312.
Glasser, L.A., "An Analysis of Microwave De–embedding Errors", IEEE Transactions on Microwave Theory and Techniques, vol. MTT–26, No. 5, May 1978, pp. 379–380.
Pollard, R.D., Lane, R.Q., "The Calibration Of A Universal Test Fixture", 1983 MIT–S Digest, pp. 498–500.
Vaitkus, R., Scheitlin, D., A Two–Tier Deembedding Technique For Packaged Transistors, 1982 IEEE–S Digest, pp. 328–330.

* cited by examiner

*Primary Examiner*—John Barlow
*Assistant Examiner*—Xiuqin Sun
(74) *Attorney, Agent, or Firm*—Fliesler Meyer LLP (57) ABSTRACT

Methods are provided for embedding and/or de-embedding a network having an even number of ports into a device under test (DUT) having an odd number of ports. For example, a four-port network can be embedded/de-embedded into/from a three-port device under test (DUT). This is accomplished by embedding a virtual circulator into the three-port DUT to thereby generate an artificial four-port device. The four-port network is then embedded/de-embedded into/from the artificial four-port device to thereby generate a composite four-port device. The virtual circulator is then de-embedded from the composite four-port device to thereby generate a composite three-port device that is equivalent to the four-port network embedded/de-embedded into/from the three-port DUT.

20 Claims, 7 Drawing Sheets

FIG. 12

METHODS FOR EMBEDDING AND DE-EMBEDDING USING A CIRCULATOR

BACKGROUND OF THE INVENTION

1. Field of the Invention

The present invention relates to methods for embedding and/or de-embedding networks when, for example, making measurements using a vector network analyzer (VNA). More particularly, the present invention relates to calculations for embedding and/or de-embedding networks that are not directly amenable to chain matrix calculations, such as three-port devices and semi-balanced devices with an odd number of ports.

2. Description of the Related Art

Figure 1A:
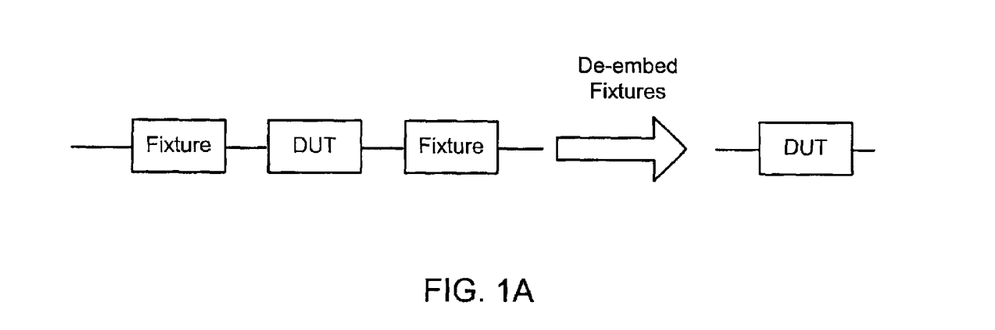
FIG. 1A is a diagram illustrating the concept of de-embedding.
Figure 1B:
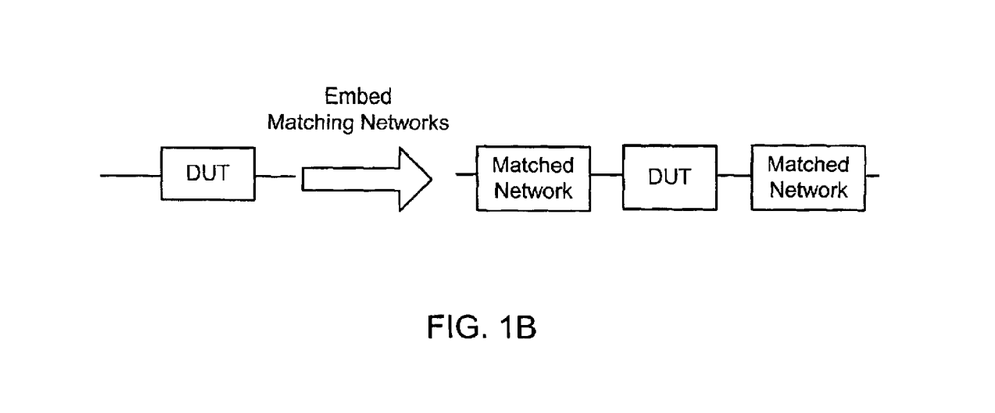
FIG. 1B is a diagram illustrating the concept of embedding.

Measurements of a device under test (DUT) using a VNA may not always be performed in a desired test environment. This is because it maybe too time intensive and/or costly to measure a DUT in a desired test environment. Accordingly, a DUT is often measured in a different environment for reasons of expediency and/or practicality, thereby requiring the use of embedding or de-embedding techniques to correct the effects of the test environment. For example, a DUT may be in a test fixture or connected via wafer probes when measurements of the DUT are made, thereby requiring the removal of the effects of the fixture or probes from the measured data for a truer picture of actual DUT performance. De-embedding techniques allows this task (i.e., removal of effects) to be performed computationally. This concept is shown in FIG. 1A. In another example, a customer may desire to see what the performance of a DUT would be with a specific matching network attached. However it may be impractical to attach the matching network during manufacturing for cost reasons. Embedding techniques allow this task (i.e., attaching the matching network) to be performed computationally. This concept is shown in FIG. 1B.

While most commercial simulators use nodal wave analysis or similar techniques for computing composite network results, these approaches may not be needed or wanted (e.g., based on computational or memory needs) for certain specific applications. Among these applications are embedding or de-embedding networks to/from a measurement. For two port devices, a chain matrix or cascading computation using transfer-matrices has been used to perform embedding and de-embedding. The concept is to re-arrange standard scattering-parameters (S-parameters) to form a pair of new matrices (termed T for transfer matrices) that can be multiplied for embedding and form the equivalent to the networks being concatenated or cascaded (i.e., one network being embedded). Multiplying by the inverse of the T-matrix (i.e., $T^{-1}$) is the equivalent of de-embedding. A key-point is that the outputs from one stage map directly to the inputs of the next stage thereby allowing the matrix multiplication to make sense.

Figure 2:
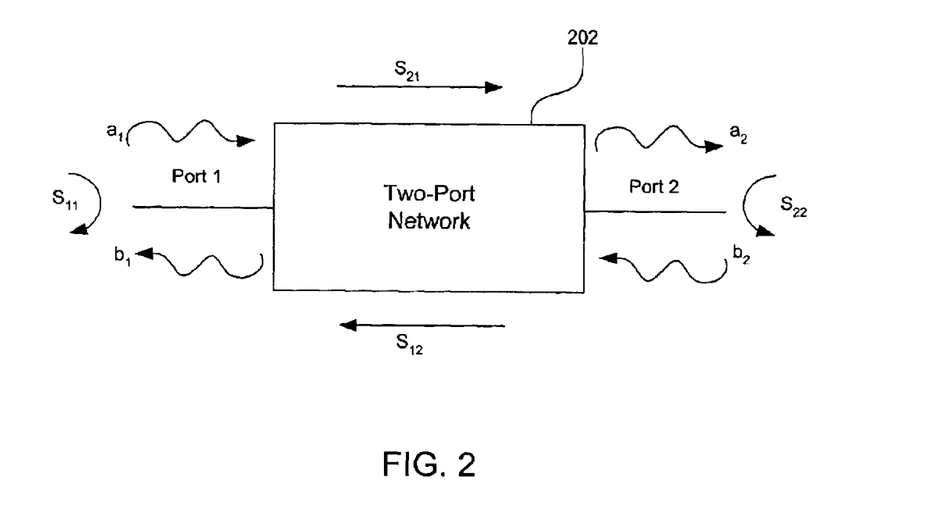
FIG. 2 is a diagram illustrating the incident and reflective waves of a two-port network.

Transfer-matrices (also known to as transmission matrices) are made up of T-parameters (also known as chain-scattering-parameters and scattering-transfer-parameters) that are defined in a manner analogous to S-parameters except the dependencies have been switched to enable the cascading discussed above. In both cases the wave variables are defined as $a_i$ for the wave incident on port i, and $b_i$ for the wave returning from port i. S-parameters of an n-port device characterize how the device interacts with signals presented to the various ports of the device. An exemplary S-parameter is "$S_{12}$". The first subscript number is the port that the signal is leaving, while the second is the port that the signal is being injected into. $S_{12}$, therefore, is the signal leaving port 1 relative to the signal being injected into port 2. Referring to FIG. 2, the incident and returning waves and the S-parameters are shown for an exemplary two-port network 202. These S-parameters are defined by Equation 1 below.

$$\begin{bmatrix} b_1 \\ b_2 \end{bmatrix} = \begin{bmatrix} S_{11} & S_{12} \\ S_{21} & S_{22} \end{bmatrix} \begin{bmatrix} a_1 \\ a_2 \end{bmatrix} \quad \text{(Equation 1)}$$

where, $a_1$ is the traveling wave incident on port 1;
$a_2$ is the traveling wave incident on port 2;
$b_1$ is the traveling wave reflected from port 1;
$b_2$ is the traveling wave reflected from port 2;
$S_{11}$ is referred to as the "forward reflection" coefficient, which is the signal leaving port 1 relative to the signal being injected into port 1;
$S_{21}$ is referred to as the "forward transmission" coefficient, which is the signal leaving port 2 relative to the signal being injected into port 1;
$S_{22}$ is referred to as the "reverse reflection" coefficient, which is the signal leaving port 2 relative to the signal being injected into port 2; and
$S_{12}$ is referred to as the "reverse transmission" coefficient, which is the signal leaving port 1 relative to the signal being injected into port 2.
(Note that the set of S-parameters $S_{11}$, $S_{12}$, $S_{21}$, $S_{22}$ make up an S-matrix)

The T-formulation is a bit different to allow for cascading. More specifically, in the T-formulation, $b_2$ and $a_2$ are independent parameters rather than $a_1$ and $a_2$ (as in the S-formulation of Equation 1). This does not change the operation of the circuit, just the situation under which the parameters are measured. Since T-parameters are rarely measured directly, this is usually not a concern. For a two-port network, the T-parameters are defined in Equation 2 shown below.

$$\begin{bmatrix} a_1 \\ b_1 \end{bmatrix} = \begin{bmatrix} T_{11} & T_{12} \\ T_{21} & T_{22} \end{bmatrix} \begin{bmatrix} b_2 \\ a_2 \end{bmatrix} \quad \text{(Equation 2)}$$

Figure 3:
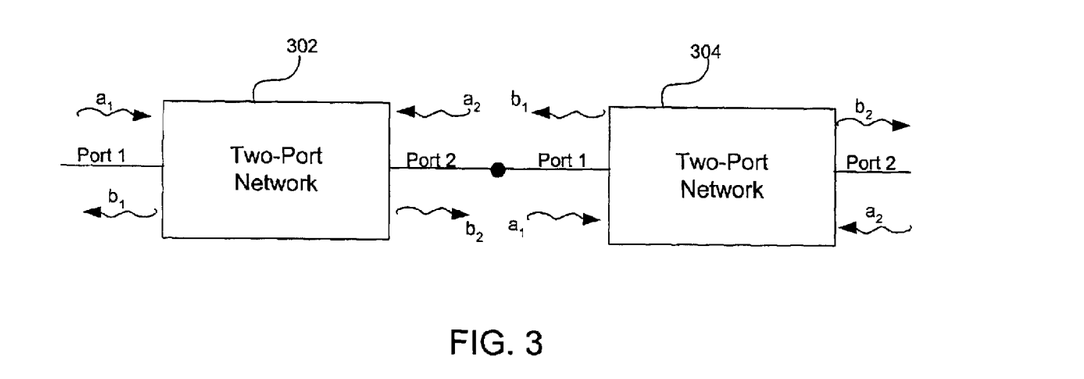
FIG. 3 is a diagram illustrating two cascaded two-port networks.

Two cascaded two-port networks 302 and 304 are shown in FIG. 3. Note the arrangement is such that when two networks are connected together, $b_2$ of network 302 at the left maps directly onto $a_1$ for network 304 on the right. Similarly, $a_2$ for network 302 on the left maps directly onto $b_1$ for network 304 on the right.

The equations for computing the T-parameters in terms of the S-parameters (and vice versa) can be mathematically derived. The results are shown below in Equations 3 and 4.

$$\begin{bmatrix} T_{11} & T_{12} \\ T_{21} & T_{22} \end{bmatrix} = \frac{1}{S_{21}} \begin{bmatrix} 1 & -S_{22} \\ S_{11} & S_{21}S_{12} - S_{11}S_{22} \end{bmatrix} \quad \text{(Equation 3)}$$

$$\begin{bmatrix} S_{11} & S_{12} \\ S_{21} & S_{22} \end{bmatrix} = \frac{1}{T_{11}} \begin{bmatrix} T_{21} & T_{11}T_{22} - T_{21}T_{12} \\ 1 & -T_{12} \end{bmatrix} \quad \text{(Equation 4)}$$

Figure 4:
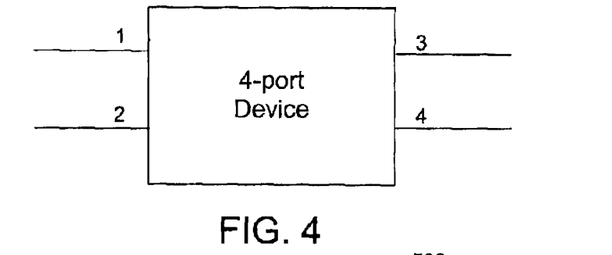
FIG. 4 is a diagram illustrating a four-port network.

The above analysis and equations are useful for embedding and/or de-embedding two-port networks. A concept for embedding and/or de-embedding four-port networks is disclosed in commonly invented and assigned U.S. patent application Ser. No. 10/050,283, entitled "Methods for Embedding and De-Embedding Balanced Networks," filed Jan. 15, 2002, which in incorporated herein by reference in its entirety. FIG. 4 illustrates such a four-port network 402 in which ports 1 and 2 are treated as a first pair of ports (with waves $a_1$, $b_1$, $a_2$ and $b_2$ being referred to as first pair waves), and ports 3 and 4 will be treated as a second pair of ports (with waves $a_3$, $b_3$, $a_4$ and $b_4$ being referred to as second pair waves). The S-parameters associated with four-port network 402 of FIG. 4 are defined by Equation 5A, shown below. To enable cascading, the waves associated with ports 3 and 4 (i.e., $a_3$, $b_3$, $a_4$ and $b_4$) are treated as independent variables of a T-matrix equation, and those associated with ports 1 and 2 (i.e., $a_1$, $b_1$, $a_2$, $b_2$) are treated as dependent variables. This leads to the T-matrix shown in Equation 5B below.

$$\begin{bmatrix} b_1 \\ b_2 \\ b_3 \\ b_4 \end{bmatrix} = \begin{bmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{bmatrix} \begin{bmatrix} a_1 \\ a_2 \\ a_3 \\ a_4 \end{bmatrix} \quad \text{(Equation 5A)}$$

$$\begin{bmatrix} a_1 \\ a_2 \\ b_1 \\ b_2 \end{bmatrix} = \begin{bmatrix} T_{11} & T_{12} & T_{13} & T_{14} \\ T_{21} & T_{22} & T_{23} & T_{24} \\ T_{31} & T_{32} & T_{33} & T_{34} \\ T_{41} & T_{42} & T_{43} & T_{44} \end{bmatrix} \begin{bmatrix} b_3 \\ b_4 \\ a_3 \\ a_4 \end{bmatrix} \quad \text{(Equation 5B)}$$

Figure 5A:
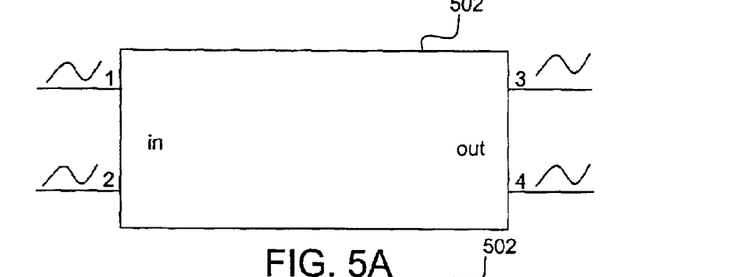
FIGS. 5A–5D are diagrams illustrating the behavior of a class of balanced devices.
Figure 5B:
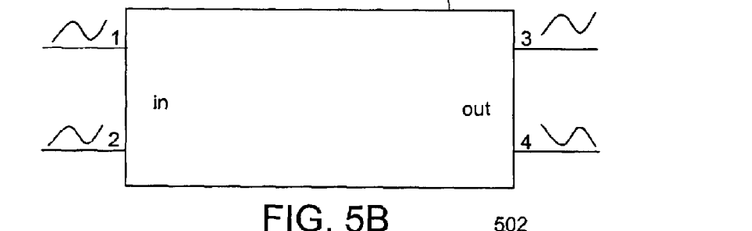
Figure 5C:
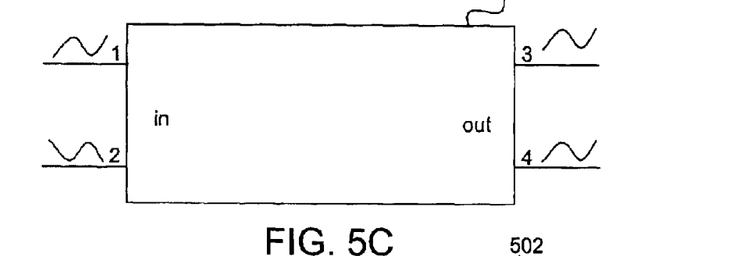
Figure 5D:
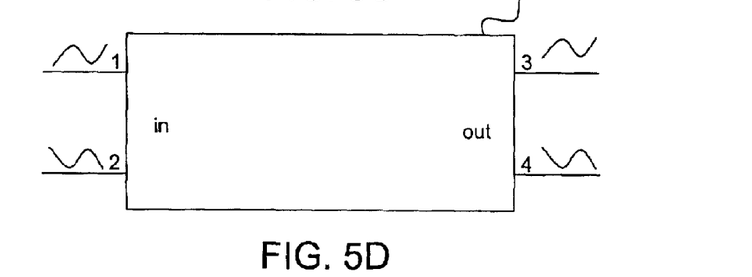

The four-port network of FIG. 4 may be a balanced circuit. A balanced circuit, as defined herein, is a circuit that includes a pair of ports that are driven as a pair, with neither port of the pair being connected to ground. Examples of balanced circuits are circuits that have differential or common mode inputs. A balanced circuit need not be completely symmetrical. Balanced circuits have often been used in the pursuit of lower power consumption, smaller size, better electromagnetic interference (EMI) behavior and lower cost. This is especially true for consumer electronics. The behavior of the class of balanced devices are illustrated in FIGS. 5A–5D. In these FIGS., a four-port device 502 is treated as two pairs of ports (i.e., ports 1 and 2 making up one pair, and ports 3 and 4 making up another pair), where each pair may be driven either differentially or common mode. The outputs can also be measured in a differential or common-mode sense. FIG. 5A illustrates a common-mode (i.e., in-phase) input and a common mode output. FIG. 5B illustrates a common mode input and a differential (i.e., 180 degrees out of phase) output. FIG. 5C illustrates a differential input and a common mode output. FIG. 5D illustrates a differential input and a differential output. Additional details for embedding and/or de-embedding four-port networks are disclosed in the above incorporated patent application.

Figure 6:
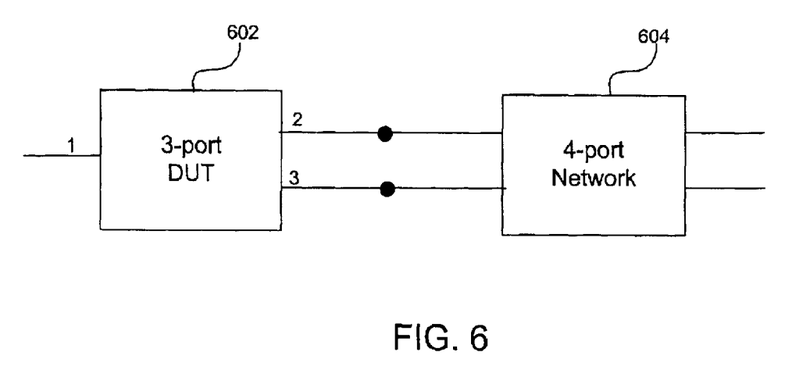
FIG. 6 is a diagram illustrating the cascading of a three-port device under test (DUT) and a four-port network.

The next obstacle/question is how to handle cascaded symmetric networks, such as one including a three-port network with one single-ended port and a balanced port pair as shown in FIG. 6. The desire here is to embed or de-embed a four-port network 604 into/from a balanced side of a three-port DUT 602.

BRIEF SUMMARY OF THE INVENTION

Embodiments of the present invention are directed to methods for embedding a network having an even number of ports into a device under test (DUT) having an odd number of ports. A circulator is embedded into the DUT to thereby generate an artificial device having an even number of ports. The network is then embedded into the artificial device to thereby generate a composite device. Finally, the circulator is de-embedded from the composite device to thereby generate a further composite device that is equivalent to the network embedded into the DUT. The above mentioned circulator need not be an actual circulator, but rather, can be a virtual circulator.

Embodiments of the present invention are also directed to methods for de-embedding a network having an even number of ports from a DUT having an odd number of ports. A circulator (e.g., a virtual circulator) is embedded into the DUT to thereby generate an artificial device having an even number of ports. The network is then de-embedded from the artificial device to thereby generate a composite device. Finally, the circulator is de-embedded from the composite device to thereby generate a further composite device that is equivalent to the network de-embedded from the DUT.

A specific embodiment of the present invention is directed to a method for embedding a four-port network into a three-port DUT. For example, this embodiment can be used to embed the four-port network into a balanced side of the three-port DUT. A circulator (e.g., a virtual circulator) is embedded into the three-port DUT to thereby generate an artificial four-port device. The artificial four-port device enables the use of four-port embedding techniques. The four-port network is then embedded into the artificial four-port device to thereby generate a composite four-port device. The circulator is then de-embedded from the composite four-port device. The result is a composite three-port device that is equivalent to the four-port network embedded into the three-port DUT.

Another embodiment of the present invention is directed to a method for de-embedding a four-port network from a three-port DUT. For example, this embodiment can be used to de-embed the four-port network from a balanced side of the three-port DUT. A circulator (e.g., virtual circulator) is embedded into the three-port DUT to thereby generate an artificial four-port device. The artificial four-port device enables the use of four-port de-embedding techniques. The four-port network is then de-embedded from the artificial four-port device to thereby generate a composite four-port device. The circulator is then de-embedded from the composite four-port device. The result is a composite three-port device that is equivalent to the four-port network de-embedded from the three-port DUT.

BRIEF DESCRIPTION OF THE DRAWINGS/FIGURES

The features, objects, and advantages of the present invention will become more apparent from the detailed description set forth below when taken in conjunction with the drawings in which like reference characters identify the same or similar elements throughout and wherein.

DETAILED DESCRIPTION OF THE INVENTION

In the description that follows, the terms network, circuit, device and structure are used interchangeably.

Among other things, the present invention addresses the obstacle/question of how to handle incompletely balanced networks, such a three-port network with one balanced port as shown in FIG. 6. Specifically, as mentioned above, a desire is to embed or de-embed four-port network 604 into/from the balanced side of three-port DUT 602. The present invention more generally provides methods for embedding/de-embedding a network having an even number of ports into/from a DUT having an odd number of ports.

One possibility for embedding/de-embedding four-port network 604 into/from the balanced side of three-port DUT 602 is to try to construct a 3×4 matrix formalism to allow for appropriate matrix multiplication. Another possible solution is to characterize three-port DUT 602 as a four-port matrix by zeroing out the appropriate entries of the matrix. However, these solutions cause unacceptable singularities, which are defined herein as points at which an equation diverges to infinity. To see this, consider the equations linking T-parameters and S-parameters for two-port networks (Equations 3 and 4). Note that a parameter always ends up in the denominator so that if $S_{21}=0$, there is a computation problem. For four-port networks, the common denomination is slightly more complex, as can be appreciated from Equation 6, shown below. Equation 6 is the denominator for T-parameters expressed in terms of S-parameters for a four-port network.

$$\text{denom} = S_{32}S_{41} - S_{42}S_{31} \quad \text{(Equation 6)}$$

Thus, if all of the S-parameters associated with a single port were zeroed out (to make the four-port network into a three-port network), then the denominator would unacceptably vanish (since each port index shows up in each denominator term of Equation 6). Additionally, a number other than zero would lead to conservation of energy problems. Attempting to produce a 3×4 matrix formalism, which builds in the non-transmission to a forth port, leads to the same problem.

Figure 7:
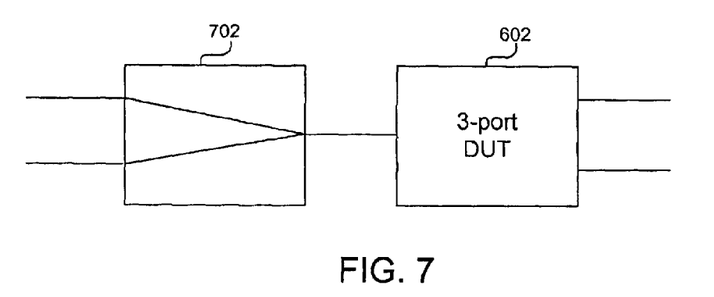
FIG. 7 is a diagram illustrating a splitter added to the three-port DUT of FIG. 6.

Another possible solution is to create a four-port device from a three-port DUT. For example, as shown in FIG. 7, a splitter 702 can be embedded into three-port DUT 602. Such a splitter would need to be substantially ideal. However, even assuming ideality, the symmetry of the splitter causes problems. The splitter would cause $S_{32}=S_{31}$ and $S_{42}=S_{41}$. Considering Equation 6 again, this would cause the denominator to be zero.

A solution of using a substantially lossless and perfectly matched device up front would make things easier in that a second de-embedding step is not required. The losslessness results in a non-reciprocal device that fortunately removes the symmetry problem of the splitter implementation, discussed above. In one embodiment, such a device is a circulator, which is a device that causes signal flow in only one direction (either clockwise or counter clockwise).

Figure 8:
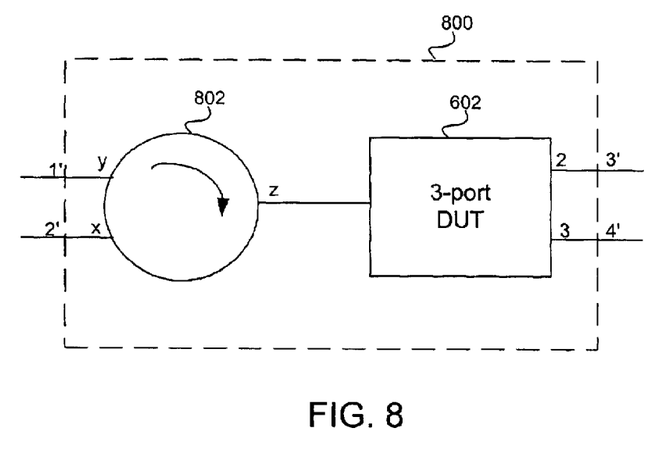
FIG. 8 is a diagram illustrating a circulator added to the three-port DUT of FIG. 6, to thereby produce an artificial four-port DUT.

Referring to the embodiment of FIG. 8, a circulator 802 is embedded into three-port DUT 602 to thereby convert three-port DUT 602 to an artificial four-port DUT 800. The ports of circulator 802 are labeled x, y and z, so as to not confuse the numbering of these ports with the numbering of the ports of DUT 602. The signal flow is shown to be occurring in the clockwise direction, as signified by the arrow. Thus, for this example, any signal entering port x will flow to and leave port y. Any signal entering port y will flow to and leave port z. Similarly, any signal entering port z will flow to and leave port x.

The S-matrix associated with DUT 602 (without circulator 802) is represented in Equation 7, shown below.

$$\begin{bmatrix} S_{11} & S_{12} & S_{13} \\ S_{21} & S_{22} & S_{23} \\ S_{31} & S_{32} & S_{33} \end{bmatrix} \quad \text{(Equation 7)}$$

When circulator 802 is embedded into three-port DUT 602, as shown in FIG. 8, circulator 802 and DUT 602 together form artificial four-port DUT 800 (thereby converting three-port DUT 602 to artificial four-port DUT 800, as mentioned above). The ports of four-port DUT 800 are labeled ports 1', 2', 3' and 4' so that they are not confused with the actual ports of DUT 602.

Embedding of circulator 802 can be performed, for example, using S-parameters associated with a substantially ideal circulator 802. The circulator can be a virtual circulator, meaning that the circulator can merely be mathematically present (i.e., not physically inserted). The embedding of a virtual circulator will be understood from the discussions set forth below.

The S-matrix associated with artificial four-port DUT 800 is represented in Equation 8, shown below.

$$\begin{bmatrix} S_{1'1'} & S_{1'2'} & S_{1'3'} & S_{1'4'} \\ S_{2'1'} & S_{2'2'} & S_{2'3'} & S_{2'4'} \\ S_{3'1'} & S_{3'2'} & S_{3'3'} & S_{3'4'} \\ S_{4'1'} & S_{4'2'} & S_{4'3'} & S_{4'4'} \end{bmatrix} \quad \text{(Equation 8)}$$

Based on the definition of S-parameters, the S-parameters of the first row of the S-matrix of Equation 8 all relate to signals leaving port 1' of artificial four-port DUT 800. More specifically, $S_{1'1'}$ represents the signal leaving port 1' relative to the signal being injected into port 1'; $S_{1'2'}$ represents the signal leaving port 1' relative to the signal being injected into port 2'; $S_{1'3'}$ represents ths signal leaving port 1' relative to the signal being injected into port 3'; and $S_{1'4'}$ represents the signal leaving port 1' relative to the signal being injected into port 4'. Due to the nature of circulator 802, when a signal is injected into port 1' it will travel into DUT 602, but any signal being reflected back will never leave port 1'. Similarly, due to the nature of circulator 802, when a signal is injected into port 3' or 4', the signal will never leave port 1. In fact, the only signal that will leave port 1' is the signal being injected into port 2', due to the nature of circulator 802.

Based on the definition of S-parameters, the S-parameters of the second column of the S-matrix of Equation 8 all relate to signals being injected into port 2'. More specifically, $S_{1'2'}$ represents the signal leaving port 1' relative to the signal being injected into port 2'; $S_{2'2'}$ represents the signal leaving port 2' relative to the signal being injected into port 2'; $S_{3'2'}$ represents the signal leaving port 3' relative to the signal being injected into port 2'; and $S_{4'2'}$ represents the signal leaving port 4' relative to the signal being injected into port 2'. Due to the nature of circulator 802, when a signal is injected into port 2' it will always leave port 1'.

Based on the above realizations regarding the first row and the second column of the S-matrix of Equation. 8, it is clear that the seven S-parameters associated with the first row and the second column of the S-matrix are "don't cares." These are "don't cares" because these S-parameters do not impact the behavior of artificial four-port device 800. The only requirements of the "don't cares" is that singularities do not result. One solution is to fill the "don't cares" in with unity (i.e., 1) and adjust values if singularities are approached. Again, the values of "don't cares" does not matter (except they should not produce singularities) because in the end they will wash out. Obviously, the "don't cares" should not be zero, because that would cause singularities. Preferably, the "don't care" values should have about the same order of magnitude as the other S-parameters. For this reason, choosing a value of one (i.e., unity) is acceptable. However, other values are also acceptable.

This leaves nine remaining S-parameters that need to be determined for artificial four-port DUT 800. Looking at FIG. 8, and understanding the nature of circulator 802, it is clear that $S_{2'1'}$ associated with artificial four-port DUT 800 is equal to $S_{11}$ associated with three-port DUT 602 (which is already known). This is because a signal injected into port 1' of DUT 800 will enter port 1 of DUT 602, with any reflections traveling back through port 1 of DUT 602 and then leaving port 2' of DUT 800. Similarly, $S_{3'1'}$ associated with four-port DUT 800 is equal to $S_{21}$ associated with three-port DUT 800. This is because a signal injected into port 1' will enter port 1 of DUT 602 with any signal leaving port 2 of DUT 602 also leaving port 3' of DUT 800. Similar analysis will show that: $S_{4'1'}$ is equal to $S_{31}$; $S_{2'3'}$ is equal to $S_{12}$; $S_{3'3'}$ is equal to $S_{22}$; $S_{4'3'}$ is equal to $S_{32}$; $S_{2'4'}$ is equal to $S_{13}$; $S_{3'4'}$ is equal to $S_{23}$; and $S_{4'4'}$ is equal to $S_{33}$.

The S-parameters of artificial four-port DUT 800 (with virtual circulator 802 embedded) can now be written in terms of the three-port S-parameters of DUT 602, to produce Equation 9, shown below. In other words, Equation 9 is created by replacing the "don't cares" of Equation 8 with unity and replacing the remaining nine S-parameters of DUT 802 with the equivalent S-parameters of DUT 602 (which are known).

$$\begin{bmatrix} 1 & 1 & 1 & 1 \\ S_{11} & 1 & S_{12} & S_{13} \\ S_{21} & 1 & S_{22} & S_{23} \\ S_{31} & 1 & S_{32} & S_{33} \end{bmatrix} \quad \text{(Equation 9)}$$

The S-matrix of Equation 9 is a 4×4 matrix that is representative of artificial four-port DUT 800. Stated another way, the S-matrix of Equation 9 is a 4×4 matrix that is representative of three-port DUT 602 with circulator 802 embedded into it.

Using the S-matrix of Equation 9, four-port embedding and de-embedding techniques can now be performed. Balanced four-port network 604 (shown in FIG. 6) can now be embedded/de-embedded into/from four-port DUT 800 (which, remember, is three-port DUT 602 with circulator 802 embedded into it). For example, the methods of U.S. patent application Ser. No. 10/050,283 (incorporated by reference above) can be used to perform embedding or de-embedding. As described in detail in U.S. patent application Ser. No. 10/050,283, this is accomplished by: generating a transfer-matrix for each four-port network (e.g., DUT 800 and four-port network 604) based on the corresponding set of scattering-parameters for each four-port network. Next, to accomplish embedding, the transfer-matrices are multiplied to thereby produce a composite transfer-matrix. To accomplish de-embedding, the transfer matrix for the DUT is multiplied by the inverse transfer-matrix ($T^{-1}$) of the network to be de-embedded. Finally, a set of composite scattering-parameters is generated based on the composite transfer-matrix. The set of composite scattering-parameters are representative of four-port DUT 800 with four-port network 604 embedded into it (or de-embedded from it). It is noted that the present invention is not limited to the use of the methods of U.S. patent application Ser. No. 10/050,283, to accomplish the embedding/de-embedding of a four-port network into/from another four-port network. Rather, any appropriate method can be used.

Assume Equation 10 is a composite S-matrix representative of four-port DUT 800 with four-port network 604 embedded into it.

$$\begin{bmatrix} S'_{11} & S'_{12} & S'_{13} & S'_{14} \\ S'_{21} & S'_{22} & S'_{23} & S'_{241} \\ S'_{31} & S'_{32} & S'_{33} & S'_{34} \\ S'_{41} & S'_{42} & S'_{43} & S'_{44} \end{bmatrix} \quad \text{(Equation 10)}$$

Figure 9:
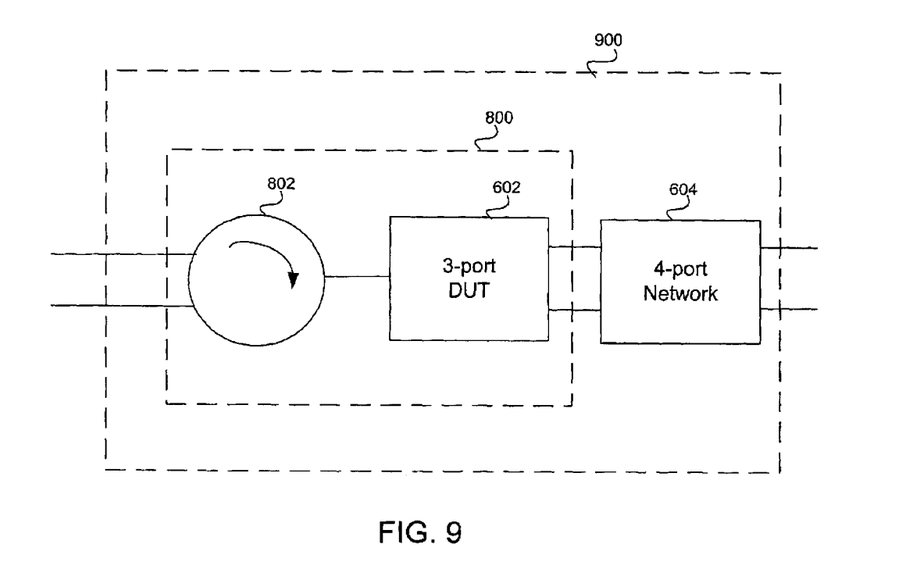
FIG. 9 is a diagram illustrating the embedding of a four-port network into an artificial four-port DUT, to thereby produce a composite four-port network.

FIG. 9 illustrates the embedding of four-port network 604 into artificial four-port DUT 800, which produces a composite four-port network 900. It is clear from FIG. 9, that if circulator 802 is de-embedded, the resulting network would be four-port network 604 embedded into three-port DUT 602 (i.e., three-port DUT 602 with four-port network 604 embedded into it), which is what is desired. Thus, the next step is to de-embed circulator 802.

In the discussion of FIG. 8 and Equation 9, circulator 802 was embedded into DUT 602 by filling in "don't cares" (e.g., unity) into row one and column two of a 4×4 matrix. This was appropriate due to the nature of circulator 802, as explained. For the similar reasons, row 1 and column 2 of the S-matrix of Equation 10 can be removed to effectively de-embed circulator 602. This is because row 1 and column 2 of the S-matrix of Equation 10 only relate to the behavior of virtual circulator, that is to be de-embedded now. The result is Equation 11, which is a 3×3 S-matrix that includes the S-parameters for three-port DUT 602 with four-port network 604 embedded into it.

$$\begin{bmatrix} S'_{21} & S'_{23} & S'_{24} \\ S'_{31} & S'_{33} & S'_{34} \\ S^1_{41} & S'_{43} & S'_{44} \end{bmatrix} \quad \text{(Equation 11)}$$

Figure 10:
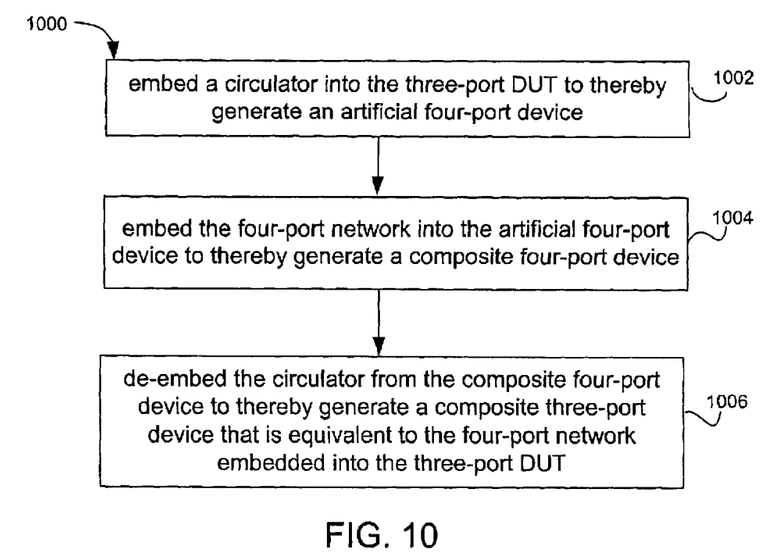
FIG. 10 is a flow diagram describing a method for embedding a four-port network into a 3-port DUT, according to an embodiment of the present invention.

The above discussion is summarized in a flow chart of FIG. 10, which illustrates a method 1000 for embedding a four-port network into a three-port DUT.

At a step 1002, a circulator (e.g., a virtual circulator 802) is embedded into the three-port DUT (e.g., 3-port DUT 602) to thereby generate an artificial four-port device (e.g., four-port artificial device 800). This can be accomplished by first acquiring a 3×3 S-matrix for the three-port DUT. Such a 3×3 S-matrix is made up of a set of S-parameters, which includes $S_{11}$, $S_{12}$, $S_{13}$, $S_{21}$, $S_{22}$, $S_{23}$, $S_{31}$, $S_{32}$ and $S_{33}$. These S-parameters may be known (e.g., predetermined). Alternatively, these S-parameters can be measured, for example, using a VNA or any alternative known method. A 4×4 S-matrix (representative of the artificial four-port device, e.g., device 800) is then generated based on characteristics of the virtual circulator and based on the 3×3 S-matrix. An exemplary process for generating the 4×4 S-matrix from the 3×3 S-matrix is described in detail above.

At a next step 1004, the four-port network (e.g., four-port network 604) is embedded into the artificial four-port device (e.g., artificial device 800) that was generated at step 1002. This generates a composite four-port device (e.g., composite device 900). Additional details of step 1004 are discussed with reference to FIG. 12.

Finally, at a step 1006, the circulator (e.g., virtual circulator 802) is de-embedded from the composite four-port device to thereby generate a composite three-port device that is equivalent to the four-port network embedded into the three-port DUT. As explained above, this can be accomplished by removing an appropriate row and column from the 4×4 composite S-matrix, based on the characteristics of the circulator.

Figure 11:
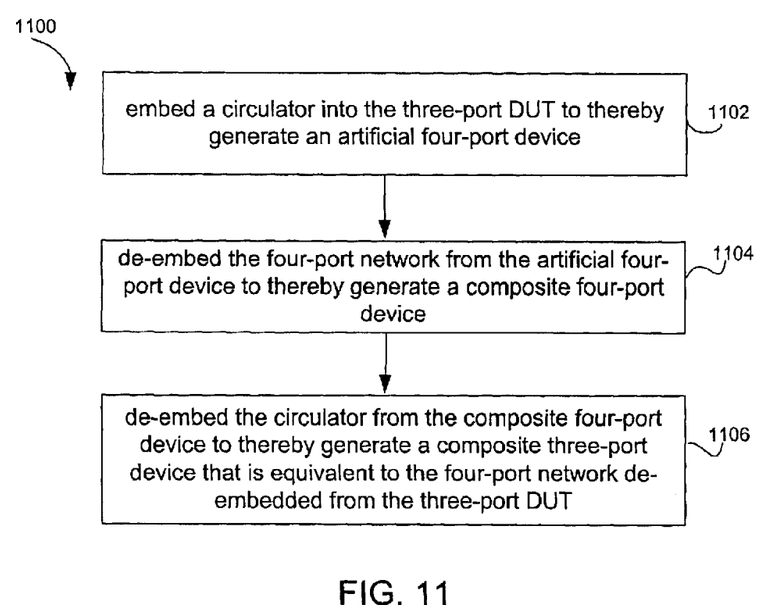
FIG. 11 is a flow diagram describing a method for de-embedding a four-port network from a 3-port DUT, according to an embodiment of the present invention.

FIG. 11 is a flow diagram that illustrates a method 1100 for de-embedding a four-port networks from a three-port DUT. Method 1100 is very similar to method 1000, as will be appreciated from the following discussion.

At a step 1102, a circulator (e.g., virtual circulator 802) is embedded into the three-port DUT (e.g., 3-port DUT 602) to thereby generate an artificial four-port device (e.g., four-port artificial device 800). Step 1102 is identical to step 1002.

At a next step 1104, the four-port network (e.g., four-port network 604) is de-embedded from the artificial four-port device (e.g., artificial device 800) that was generated at step 1102. This generates a composite four-port device. Additional details of step 1104 are discussed with reference to FIG. 12.

Finally, at a step 1106, the circulator (e.g., virtual circulator 802) is de-embedded from the composite four-port device to thereby generate a composite three-port device that is equivalent to the four-port network embedded into the three-port DUT. As explained above, this can be accomplished by removing an appropriate row and column from the 4×4 composite S-matrix, based on the characteristics of the circulator.

Figure 12:
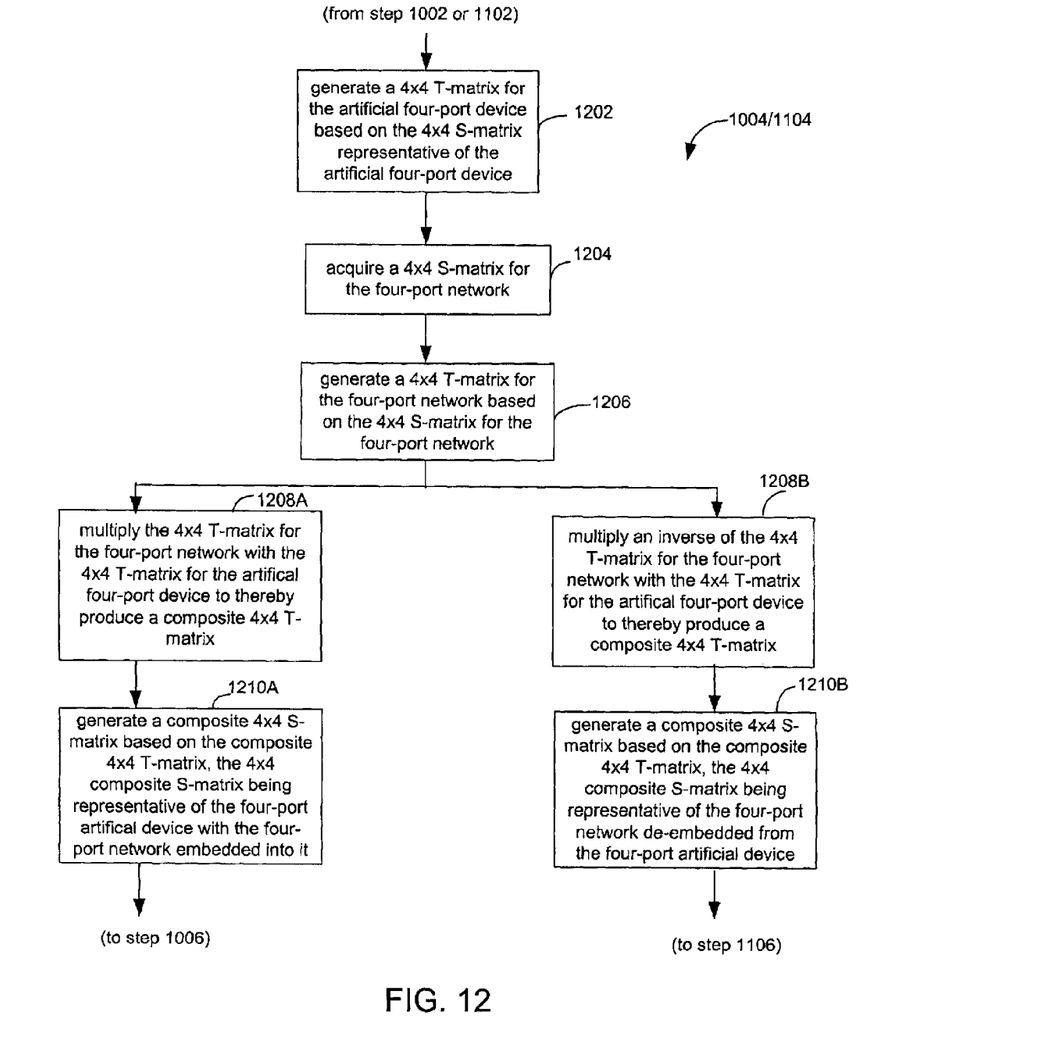
FIG. 12 is a flow diagram that is used to describe additional details of steps shown in FIGS. 10 and 11.

The flow diagram of FIG. 12 shall now be used to describe further details of step 1004 (of FIG. 10) and step 1104 (of FIG. 11).

At a step 1202 a 4×4 transfer-matrix is generated for the artificial four-port device (e.g., artificial device 800) based on the 4×4 scattering-matrix representative of the artificial four-port device.

At a step 1204, a 4×4 S-matrix is acquired for the four-port network. This S-matrix is made up of S-parameters that may be known (e.g., predetermined). Alternatively, these S-parameters can be measured, for example, using a VNA or any alternative known method.

At a step 1206, a 4×4 transfer-matrix is generated for the four-port network based on the 4×4 S-matrix for the four-port network.

At a step 1208A, a composite 4×4 transfer-matrix is produced by multiplying the 4×4 transfer-matrix for the four-port network with the 4×4 transfer-matrix for the artificial four-port device to thereby produce a composite 4×4 transfer-matrix. Then at a step 1210A, a composite 4×4 scattering-matrix is generated based on the composite 4×4 transfer-matrix. This composite 4×4 S-matrix is representative of the four-port artificial device with the four-port network embedded into it.

If the desire is to de-embed the four-port network as called for in step 1104 of FIG. 11 (rather then embed it), then at a step 1208B, a composite 4×4 transfer-matrix is produced by multiplying an inverse of the 4×4 transfer-matrix (i.e., $T^{-1}$) for the four-port network with the 4×4 transfer-matrix for the artificial four-port device to thereby produce a composite 4×4 transfer-matrix. Then at a step 1210B, a composite 4×4 scattering-matrix is generated based on the composite 4×4 transfer-matrix. This 4×4 composite S-matrix is representative of the four-port artificial device with the four-port network de-embedded from it.

Steps 1202–1208 are explained in additional detail in the discussion of FIGS. 6–9.

Specific embodiments discussed above explain how to embed/de-embed a four-port network into/from a three-port DUT. However, those of ordinary skill in the art reading the above description will appreciate that the use of a circulator to embed/de-embed other networks having an odd number of ports into/from other DUTs having an even number of ports are within the spirit and scope of the present invention.

The foregoing description of the preferred embodiments has been provided to enable any person skilled in the art to make or use the present invention. While the invention has been particularly shown and described with reference to preferred embodiments thereof, it will be understood by those skilled in the art that various changes in form and details may be made therein without departing from the spirit and scope of the invention.

The present invention has been described above with the aid of flow diagrams illustrating the performance of specified steps and relationships thereof. The boundaries of the blocks within the flow diagrams have often been arbitrarily defined herein for the convenience of the description. Alternate boundaries can be defined so long as the specified steps and relationships thereof are appropriately performed. Any such alternate boundaries are thus within the scope and spirit of the claimed invention. Thus, the breadth and scope of the present invention should not be limited by any of the above-described exemplary embodiments, but should be defined only in accordance with the following claims and their equivalents.

What is claimed is:

1. A method for embedding a four-port network into a three-port device under test (DUT), the method comprising the steps of:

(a) embedding a circulator into the three-port DUT to thereby generate an artificial four-port device;

(b) embedding the four-port network into the artificial four-port device to thereby generate a composite four-port device; and (c) de-embedding the circulator from the composite four-port device to thereby generate a composite three-port device that is equivalent to the four-port network embedded into the three-port DUT.

2. The method of claim 1, wherein step (a) comprises embedding a virtual circulator into the three-port DUT to thereby generate the artificial four-port device.

3. The method of claim 2, wherein step (a) comprises:

(a.1) acquiring a 3×3 scattering-matrix for the three-port DUT; and (a.2) generating a 4×4 scattering-matrix based on characteristics of the virtual circulator and based on the 3×3 scattering-matrix for the three-port DUT, the 4×4 scattering-matrix being representative of the artificial four-port device.

4. The method of claim 3, wherein step (b) comprises:

(b.1) generating a 4×4 transfer-matrix for the artificial four-port device based on the 4×4 scattering matrix representative of the artificial four-port device;

(b.2) acquiring a 4×4 scattering-matrix for the four-port network;

(b.3) generating a 4×4 transfer-matrix for the four-port network based on the 4×4 scattering matrix for the four-port network;

(b.4) multiplying the 4×4 transfer-matrix for the four-port network with the 4×4 transfer-matrix for the artificial four-port device to thereby produce a composite 4×4 transfer-matrix; and (b.5) generating a composite 4×4 scattering-matrix based on the composite 4×4 transfer-matrix, the 4×4 composite scattering-matrix being representative of the four-port artificial device with the four-port network embedded into it.

5. The method of claim 4, wherein step (c) comprises removing an appropriate row and column from the 4×4 composite scattering-matrix, based on the characteristics of the virtual circulator, to thereby generate a composite 3×3 scattering-matrix that is representative of the four-port network embedded into the three-port DUT.

6. The method of claim 5, wherein step (c) comprises removing a first row and a second column from the 4×4 composite scattering-matrix to thereby generate a composite 3×3 scattering-matrix that is representative of the four-port network embedded into the three-port device.

7. The method of claim 1, wherein the three-port DUT includes a balanced pair.

8. The method of claim 7, wherein steps (a), (b) and (c) embed the four-port network into the balanced pair of ports of the three-port DUT.

9. A method for embedding a network into a device under test (DUT) having an odd number of ports, the method comprising the steps of:

(a) embedding a circulator into the DUT to thereby generate an artificial device having an even number of ports;

(b) embedding the network into the artificial device to thereby generate a composite device; and (c) de-embedding the circulator from the composite device to thereby generate a further composite device that is equivalent to the network embedded into the DUT.

10. The method of claim 9 wherein step (a) comprises embedding a virtual circulator into the DUT to thereby generate an artificial device having an even number of ports.

11. A method for de-embedding a four-port network from a three-port device under test (DUT), the method comprising the steps of:

(a) embedding a circulator into the three-port DUT to thereby generate an artificial four-port device;

(b) de-embedding the four-port network from the artificial four-port device to thereby generate a composite four-port device; and (c) de-embedding the circulator from the composite four-port device to thereby generate a composite three-port device that is equivalent to the four-port network de-embedded from the three-port DUT.

12. The method of claim 11, wherein step (a) comprises embedding a virtual circulator into the three-port DUT to thereby generate an artificial four-port device.

13. The method of claim 12, wherein step (a) comprises:

(a.1) acquiring a 3×3 scattering-matrix for the three-port DUT; and (a.2) generating a 4×4 scattering-matrix based on characteristics of the virtual circulator and based on the 3×3 scattering-matrix for the three-port DUT, the 4×4 scattering-matrix being representative of the artificial four-port device.

14. The method of claim 13, wherein step (b) comprises:

(b.1) generating a 4×4 transfer-matrix for the artificial four-port device based on the 4×4 scattering matrix representative of the artificial four-port device;

(b.2) acquiring a 4×4 scattering-matrix for the four-port network;

(b.3) generating a 4×4 transfer-matrix for the four-port network based on the 4×4 scattering matrix for the four-port network;

(b.4) multiplying the 4×4 transfer-matrix for the four-port network with an inverse of the 4×4 transfer-matrix for the artificial four-port device to thereby produce a composite 4×4 transfer-matrix; and (b.5) generating a composite 4×4 scattering-matrix based on the composite 4×4 transfer-matrix, the 4×4 composite scattering-matrix being representative of the four-port network de-embedded from the four-port artificial device.

15. The method of claim 14, wherein step (c) comprises removing an appropriate row and column from the 4×4 composite scattering-matrix, based on the characteristics of the virtual circulator, to thereby generate a composite 3×3 scattering-matrix that is representative of the four-port network dc-embedded from the three-port DUT.

16. The method of claim 15, wherein step (c) comprises removing a first row and a second column from the 4×4 composite scattering-matrix to thereby generate a composite 3×3 scattering-matrix that is representative of the four-port network dc-embedded from the three-port device.

17. The method of claim 11, wherein the three-port DUT includes a balanced pair.

18. The method of claim 17, wherein steps (a), (b) and (c) dc-embed the four-port network from the balanced pair of ports of the three-port DUT.

19. A method for de-embedding a network from a device under test (DUT) having an odd number of ports, the method comprising the steps of:

(a) embedding a circulator into the DUT to thereby generate an artificial device having an even number of ports;

(b) de-embedding the network from the artificial device to thereby generate a composite device; and (c) de-embedding the circulator from the composite device to thereby generate a further composite device that is equivalent to the network de-embedded from the DUT.

20. The method of claim 19, wherein step (a) comprises embedding a virtual circulator into the DUT to thereby generate the artificial device having an even number of ports.

* * * * *

UNITED STATES PATENT AND TRADEMARK OFFICE
CERTIFICATE OF CORRECTION

PATENT NO. : 6,832,170 B2
DATED : December 14, 2004
INVENTOR(S) : Jon S. Martens It is certified that error appears in the above-identified patent and that said Letters Patent is hereby corrected as shown below:

Column 12,
Lines 35, 40 and 44, delete "dc-embed" and insert therefor -- de-embed --.

Signed and Sealed this

Twelfth Day of April, 2005

JON W. DUDAS
*Director of the United States Patent and Trademark Office*